US012063800B2

(12) United States Patent
Yamaguchi et al.

(10) Patent No.: US 12,063,800 B2
(45) Date of Patent: Aug. 13, 2024

(54) PHOTOELECTRIC CONVERSION ELEMENT THAT REDUCES A RESIDUAL IMAGE WHILE ENHANCING HEAT RESISTANCE

(71) Applicant: CANON KABUSHIKI KAISHA, Tokyo (JP)

(72) Inventors: Tomona Yamaguchi, Tokyo (JP); Takayuki Sumida, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 74 days.

(21) Appl. No.: 17/220,747

(22) Filed: Apr. 1, 2021

(65) Prior Publication Data

US 2021/0313531 A1 Oct. 7, 2021

(30) Foreign Application Priority Data

Apr. 7, 2020 (JP) ................. 2020-068921

(51) Int. Cl.
*H10K 39/32* (2023.01)
*H10K 85/10* (2023.01)
(Continued)

(52) U.S. Cl.
CPC .......... *H10K 39/32* (2023.02); *H10K 85/111* (2023.02); *H10K 30/10* (2023.02); *H10K 85/615* (2023.02);
(Continued)

(58) Field of Classification Search
CPC .. H01L 27/307; H01L 51/0035; Y02E 10/549
(Continued)

(56) References Cited

U.S. PATENT DOCUMENTS

2006/0185715 A1* 8/2006 Hammerbacher .... H01L 31/048
136/250
2015/0144198 A1* 5/2015 Irwin .................... C09B 23/105
136/263
(Continued)

FOREIGN PATENT DOCUMENTS

JP 2011187937 A 9/2011
JP 2013157180 A 8/2013
(Continued)

OTHER PUBLICATIONS

Ip, A.H., et al., "Hybrid passivated colloidal quantum dot solids", Nature Nanotechnology, Sep. 2012, pp. 577-582, vol. 7, No. 9.

*Primary Examiner* — Quoc D Hoang
(74) *Attorney, Agent, or Firm* — Canon U.S.A., Inc. I.P. Division

(57) ABSTRACT

A photoelectric conversion element that reduces a residual image while enhancing heat resistance and includes a first electrode; a photoelectric conversion layer; a first interfacial layer; and a second electrode in this order, the photoelectric conversion layer has a quantum dot, the quantum dot is a PbS quantum dot, the first interfacial layer has an organic compound having a glass transition temperature of 100° ° C. or higher, and the following Equation (1) is met: $\mu h_{EBL} \geq 1.0 \times 10^{-3}$ (cm$^2$/Vs) . . . (1), where $\mu h_{EBL}$ denotes hole mobility of the first interfacial layer.

16 Claims, 6 Drawing Sheets

(51) Int. Cl.
  *H10K 30/10* (2023.01)
  *H10K 85/60* (2023.01)
(52) U.S. Cl.
  CPC ......... *H10K 85/626* (2023.02); *H10K 85/633* (2023.02); *H10K 85/6572* (2023.02)
(58) Field of Classification Search
  USPC .......................................................... 257/21
  See application file for complete search history.

(56)  References Cited

U.S. PATENT DOCUMENTS

2018/0182562 A1* 6/2018 Alghamdi ............ H01G 9/2059
  2018/0308998 A1* 10/2018 Swelm ............ H01L 31/022425
  2020/0263083 A1* 8/2020 Kim ...................... C09K 11/025
  2020/0395414 A1* 12/2020 Kim .......................... G02B 1/18

FOREIGN PATENT DOCUMENTS

JP       2017063008 A     3/2017
  JP       2017516320 A     6/2017
  JP       2018085427 A     5/2018
  JP       2018529214 A    10/2018
  JP       2019507954 A     3/2019

* cited by examiner

PHOTOELECTRIC CONVERSION ELEMENT THAT REDUCES A RESIDUAL IMAGE WHILE ENHANCING HEAT RESISTANCE

BACKGROUND OF THE INVENTION

Field of the Invention

The present disclosure relates to a photoelectric conversion element.

Description of the Related Art

Conventionally, as a photoelectric conversion unit of a photo-detection device forming a solid state imaging device, a photodiode with an impurity diffusion layer formed on a single-crystal silicon substrate has been widely used. In recent years, a photo-detection device made of a photoelectric conversion film with an organic material or a nanoparticle referred to as a colloidal quantum dot having high photosensitivity in a long wavelength region for which a silicon has low sensitivity has been proposed. These photoelectric conversion films can be formed by a simple process such as vacuum deposition or application. Thus, when a photoelectric conversion film is formed on an upper part of a substrate, that is, a light incident side, it is possible to form a photo-detection device that enables a reduction in an area per pixel and has high efficiency for light utilization.

Japanese Patent Application Laid-Open No. 2013-157180 discloses a method for manufacturing a quantum dot film and a photoelectric conversion device. Japanese Patent Application Laid-Open No. 2018-529214 discloses a method of synthesizing large monodispersed nanoparticles and a device thereof. Further, Nat Nanotechnol. 2012 Sep; 7 (9): 577-82 discloses that photoelectric conversion efficiency is improved by introducing an inorganic ligand with an organic ligand as a protection ligand for protecting a defect of a PbS quantum dot. In all the above disclosure, a carrier transportation layer is provided between a photoelectric conversion layer and an electrode, which contributes to improvement of photoelectric conversion efficiency and a reduction in dark current.

In all of the above, however, only elemental studies of a photoelectric conversion device are disclosed, and a disadvantage due to a residual image in a photoelectric conversion film image sensor or a heat treatment in the actual manufacturing is not considered in detail.

SUMMARY OF THE INVENTION

Accordingly, the present disclosure intends to provide a photoelectric conversion element that reduces a residual image while enhancing heat resistance.

A first photoelectric conversion element of the present disclosure includes: a first electrode: a photoelectric conversion layer: a first interfacial layer; and a second electrode in this order, the photoelectric conversion layer has a quantum dot, the quantum dot is a PbS quantum dot, the first interfacial layer has an organic compound having a glass transition temperature of 100° C. or higher, and the following Equation (1) is met: $\mu h_{EBL} \geq 1.0 \times 10^{-3}$ (cm²/Vs) ... (1), where $\mu h_{EBL}$ denotes hole mobility of the first interfacial layer.

Further, a second photoelectric conversion element of the present disclosure includes: a first electrode; a photoelectric conversion layer; a first interfacial layer; and a second electrode in this order, the photoelectric conversion layer has a quantum dot, the first interfacial layer has an organic compound having a glass transition temperature of 100° C. or higher, and the following Equation (2) is met: $\mu h_{EBL}/\mu h_{PH} > 10$ ... (2), where $\mu h_{EBL}$ denotes hole mobility of the first interfacial layer, and $\mu h_{PH}$ denotes hole mobility of the photoelectric conversion layer.

Furthermore, a third photoelectric conversion element of the present disclosure includes: a first electrode: a photoelectric conversion layer; a first interfacial layer: and a second electrode in this order, the photoelectric conversion layer has a quantum dot, the first interfacial layer has an organic compound, the organic compound has a triarylamine moiety in a molecular structure and a fluorene moiety or a carbazole moiety, and the following Equation (2) is met: $\mu h_{EBL}/\mu h_{PH} > 10$ ... (2), where $\mu h_{EBL}$ denotes hole mobility of the first interfacial layer, and $\mu h_{PH}$ denotes hole mobility of the photoelectric conversion layer.

Further features of the present disclosure will become apparent from the following description of exemplary embodiments with reference to the attached drawings.

DESCRIPTION OF THE EMBODIMENTS

Figure 1:
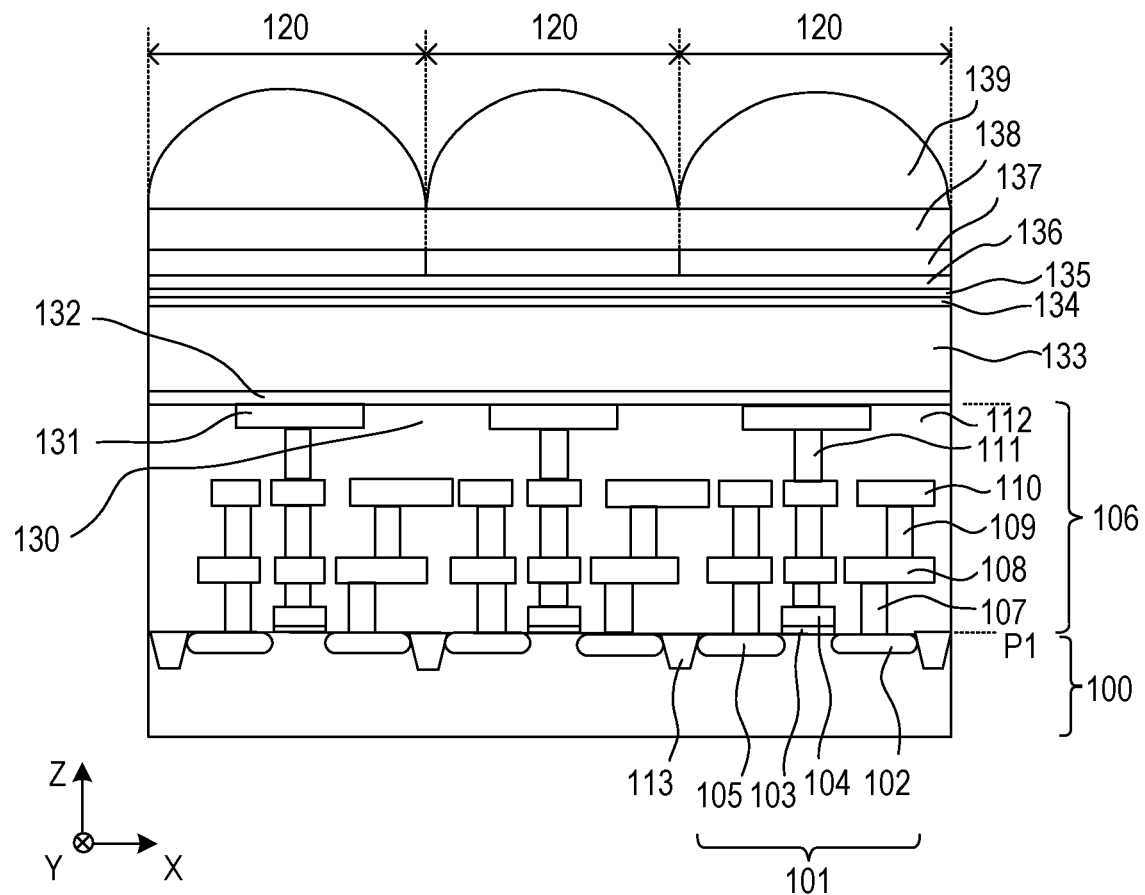
FIG. 1 is a schematic sectional view illustrating a photoelectric conversion device in the present embodiment.

A photoelectric conversion element according to the present disclosure will be described below with reference to the drawings. Each embodiment illustrates an example of the present disclosure, and a value, a shape, a material, a component, an arrangement and connection of the components, or the like do not limit the present invention. For example, while a transistor, a semiconductor region, or the like are described in embodiments, conductive type thereof can be suitably changed.

Description of components labeled with the same references in the drawings is omitted as a similar configuration being referred to. Further, references may be omitted for those understood to be a repeated pattern or the same configuration.

<<Photoelectric Conversion Element and Photoelectric Conversion Device>>

FIG. 1 is a schematic sectional view illustrating three unit cells 120 of a photoelectric conversion device. Herein, FIG. 1 is a cross section taken along a plane including a Z direction, which is the upper direction, and an X direction. The unit cell 120 is also referred to as a pixel or a subpixel. All the unit cells 120 have an equivalent circuit configuration and each have at least one photoelectric conversion element. In the present embodiment, the configuration in which each unit cell 120 has one photoelectric conversion element is described. The photoelectric conversion element is configured by suitably selecting the material of a photoelectric conversion layer 133 described later. Further, a circuit configuration of a unit cell of the photoelectric conversion device is suitably set. Next, the photoelectric conversion device of FIG. 1 will be described in detail.

<Substrate 100>

In FIG. 1, the substrate 100 has a primary face P1. A material of the substrate 100 may be glass, ceramics, or the like and is a semiconductor substrate made of a silicon single crystal in the present embodiment. The substrate 100 has a transistor 101 and an element isolation portion 113. The transistor 101 includes a source/drain region 102, a gate insulation film 103, a gate electrode 104, and a source/drain region 105. The gate electrode 104 is arranged on the primary face P1. The gate insulation film 103 is located between the gate electrode 104 and the primary face P1. The source/drain region 102 and the source/drain region 105 are arranged inside the substrate 100.

<Wiring Structure 106>

On the primary face P1 of the substrate 100, a wiring structure 106 is arranged. The wiring structure 106 has a contact plug 107, a wiring layer 108, a via plug 109, a wiring layer 110, a via plug 111, and an insulation film 112. Although not illustrated in detail in FIG. 1, the insulation film 112 may be a multilayer film. General semiconductor materials can be used for these members.

<Electrode (First Electrode 131, Second Electrode 135)>

The photoelectric conversion device of FIG. 1 has a first electrode 131 and a second electrode 135. The first electrode 131 may be an electron collecting electrode, a cathode, or a negative electrode. The second electrode 135 may be a hole collecting electrode, an anode, or a positive electrode. Further, one of the first electrode 131 and the second electrode 135 may be an upper electrode, and the other may be a bottom electrode. In FIG. 1, the first electrode 131 is the bottom electrode, and the second electrode 135 is the upper electrode.

On the substrate 100, the second electrode 135 is arranged. The second electrode 135 is provided continuously over the three unit cells 120. In the present embodiment, the upper surface and the lower surface of the second electrode 135 are flat.

The first electrode 131 is arranged between the substrate 100 and the second electrode 135. At least one first electrode 131 is included for each unit cell 120. In the present embodiment, the configuration in which one first electrode 131 is arranged for each unit cell 120 is illustrated. An isolation region 130 is arranged between the plurality of first electrodes 131. The isolation region 130 may be the insulation film 112 of the wiring structure 106.

The first electrode 131 and the second electrode 135 can be formed of any materials having conductivity as an electrode. An example of a forming material for the electrode may be a metal such as platinum, gold, silver, aluminum, chromium, nickel, copper, titanium, and magnesium, an alloy or nitride thereof, metal oxide such as indium oxide and tin oxide, or complex oxide thereof (for example, ITO or IZO).

Further, the forming material for the electrode may be conductive particles of carbon black, fullerene, carbon nanotube, graphene, or the like or a conductive composite material in which the conductive particles are dispersed in a matrix of polymer binder or the like. A single type of the forming material may be used for the electrode, or two or more types of forming materials may be used for the electrode in any combination and at any ratio. In the photoelectric conversion element, at least a pair (two) of electrodes are provided, and the photoelectric conversion layer 133 is provided between the pair of electrodes. In this case, it is preferable that at least one of the pair of electrodes be transparent. This is because it is required to cause light absorbed by the photoelectric conversion layer 133 to transmit therethrough.

The electrode has a function of collecting electrons and holes generated inside the photoelectric conversion layer 133. Therefore, as a forming material for the electrode, it is preferable to use a forming material from the above materials which is suitable for collecting electrons and holes. The material of the second electrode 135 may be a material which is suitable for collecting a hole, for example, Au, ITO, or the like having a high work function. On the other hand, a material of the first electrode 131 may be a material which is suitable for collecting an electron, for example, Al, titanium, or titanium nitride having a low work function. Among others, titanium or titanium nitride is preferable. The thickness of the electrode is not particularly limited and is suitably determined in consideration of a used material, required conductivity and transparency, or the like, and the thickness of the electrode is typically greater than or equal to about 10 nm and less than or equal to about 10 μm.

<Photoelectric Conversion Layer 133>

The photoelectric conversion layer 133 is arranged between each first electrode 131 and each second electrode 135. The photoelectric conversion layer 133 performs photoelectric conversion, and the first electrode 131 can read a signal based on charges generated by photoelectric conversion.

The material of the photoelectric conversion layer 133 may be an inorganic material or may be an organic material. For example, non-crystalline (amorphous) silicon, an organic semiconductor, a quantum dot that is an aggregate of nanoparticles of a compound semiconductor material, or the like can be used for the photoelectric conversion layer. As an organic semiconductor, fullerene (C60), coumarin (C6), rhodamine 6G (R6G), quinacridone, phthalocyanine-based, naphthalocyanine-based, or the like is preferable, for example. In the present embodiment, the photoelectric conversion layer 133 has quantum dots such as colloidal quantum dots that are nanoparticles of a compound semiconductor material.

The colloidal quantum dot forming the photoelectric conversion layer 133 has a nanoparticle (average particle diameter is greater than or equal to 0.5 nm and less than 100 nm). For example, the material for the nanoparticle is a group IV semiconductor or the like, a group III-V or group II-VI compound semiconductor, or a compound semiconductor made of a combination of three or more of group II, group III, group IV, group V, and group VI elements that are general semiconductor crystals. Specifically, a semiconductor material such as PbS, PbSe, PbTe, InN, InAs, InP, InSb, InAs, InGaAs, CdS, CdSe, CdTe, Ge, CuInS, CuInSe, CuInGaSe, or Si having a relatively narrow band gap may be used.

The above is also referred to as a semiconductor quantum dot. As a quantum dot, at least one type of these semiconductor quantum dot materials is required to be included. The quantum dot may have core shell structure in which a semiconductor quantum dot material is a core and the semiconductor quantum dot material is covered with a covering compound. In a quantum dot having a size that is substantially less than or equal to an exciton Bohr radius that is unique to each semiconductor material, since the quantum size effect is expressed, a desired band gap, that is, a desired light absorption wavelength can be controlled in accordance with the size.

As a semiconductor quantum dot material, among others, PbS, PbSe, PbTe, InP, InAs, CdS, CdSe, and CdTe are desirable, and PbS or PbSe is more desirable in terms of easier synthesis of quantum dots. The exciton Bohr radius of PbS is about 18 nm, and it is desirable that the average particle diameter of a quantum dot be greater than or equal to 2 nm and less than or equal to 15 nm. A transmission electron microscope is used for measuring a particle diameter of a quantum dot. When the average particle diameter of quantum dots is greater than or equal to 2 nm, this enables easier control of crystal growth of quantum dots in synthesizing the quantum dots. The method of forming the photoelectric conversion layer 133 including an assembly of nanoparticles as a quantum dot film is not particularly limited. The film thickness of the photoelectric conversion layer 133 is not particularly limited and is preferably greater than or equal to 10 nm and more preferably greater than or equal to 50 nm in terms of obtaining a high light absorption property. Further, in terms of easier manufacturing, it is preferable that the film thickness of the photoelectric conversion layer 133 be less than or equal to 800 nm.

In a quantum dot, it is preferable that the surface of the nanoparticle be coordinated with an organic ligand, preferably, at least one type of organic ligands selected from 1,4-benzenedithiol and 1,3-benzenedithiol. Further, it is preferable that at least one type of halogens selected from iodine, chlorine, and bromine be added to the surface of a nanoparticle in the quantum dot.

<Interfacial Layer (First Interfacial Layer 134, Second Interfacial Layer 132)>

It is preferable that the photoelectric conversion device of the present embodiment have a first interfacial layer 134 and further have a second interfacial layer 132. The photoelectric conversion device of the present embodiment has the first interfacial layer 134 and the second interfacial layer 132. The first interfacial layer 134 may be an electron blocking interfacial layer or an electron blocking layer. The second interfacial layer 132 may be a hole blocking interfacial layer or a hole blocking layer.

The second interfacial layer 132 is arranged between the photoelectric conversion layer 133 and the plurality of first electrodes 131. FIG. 1 illustrates two interfacial layers isolated from each other. The first interfacial layer 134 is arranged between the photoelectric conversion layer 133 and the second electrode 135.

The interfacial layer is a layer used for ensuring electric insulation for some of carriers, that is, holes or electrons between the electrode and the photoelectric conversion layer 133. Further, the interfacial layer is a layer used for ensuring conduction for the other carrier between the electrode and the photoelectric conversion layer 133. Therefore, it can also be said that the interfacial layer is a carrier injection blocking layer. Further, the interfacial layer can function as an adhesion layer and may suppress film peeling caused by poor wettability between the electrode and the photoelectric conversion layer 133. Therefore, in terms of suppressing film peeling, it is preferable that the interfacial layer be film-formed on the overall surface of the substrate in order to increase a contact area with the photoelectric conversion layer 133. Typically, a layer that blocks electrons and conducts only holes (electron blocking interfacial layer) can be formed on an electrode that collects holes (positive electrode), and a layer that blocks holes and conducts only electrons (hole blocking interfacial layer) can be formed on an electrode that collects electrons (negative electrode).

As a material for the first interfacial layer 134 (electron blocking interfacial layer), it is preferable that the material be able to efficiently transport holes generated in the photoelectric conversion layer 133 to the second electrode 135 (positive electrode). It is preferable that the material have properties such as high hole mobility, high electric conductivity, a small hole injection barrier between the positive electrode and the material, a small hole injection barrier from the photoelectric conversion layer 133 to the electron blocking interfacial layer, or the like. Moreover, when light is taken in the photoelectric conversion layer 133 through the electron blocking interfacial layer, it is preferable to use a material having high transmittance as the material for the electron blocking interfacial layer. When visible light is taken in the photoelectric conversion layer 133, it is preferable to use a material having transparency for the transmitting visible light that is typically greater than or equal to 60%, among others, greater than or equal to 80% as the material for the transparent electron blocking interfacial layer. In this regard, the electron blocking interfacial layer material may be an inorganic semiconductor such as molybdenum oxide $MoO_3$, nickel oxide NiO, an organic material having a triarylamine moiety such as a triphenylamine moiety or a fluorene moiety, or the like.

When the first interfacial layer 134 meets one or more of the following conditions 1 to 3, it is possible to reduce a residual image while enhancing heat resistance.

Condition 1) When the quantum dot in the photoelectric conversion layer is a PbS quantum dot, the first interfacial layer 134 has an organic compound having a glass transition temperature of 100° C. or higher, and the following Equation (1) is met.

Condition 2) The first interfacial layer 134 has an organic compound having a glass transition temperature of 100° C. or higher and the following Equation (2) is met.

Condition 3) The first interfacial layer 134 has an organic compound having a triarylamine moiety and having a fluorene moiety or a carbazole moiety in a molecular structure, and the following Equation (2) is met.

$$\mu h_{EBL} \geq 1.0 \times 10^{-3} (cm^2/Vs) \quad (1)$$

$$\mu h_{EBL}/\mu h_{PH} > 10 \quad (2)$$

$\mu h_{EBL}$: hole mobility of the first interfacial layer 134

$\mu h_{PH}$: hole mobility of the photoelectric conversion layer 133

For example, the organic compound in the first interfacial layer 134 may be the compounds or the like illustrated below, and in particular, EB-2 and EB-3 are preferable. Table 1 illustrates a glass transition temperature (Tg) and $\mu h_{EBL}$ of each compound.

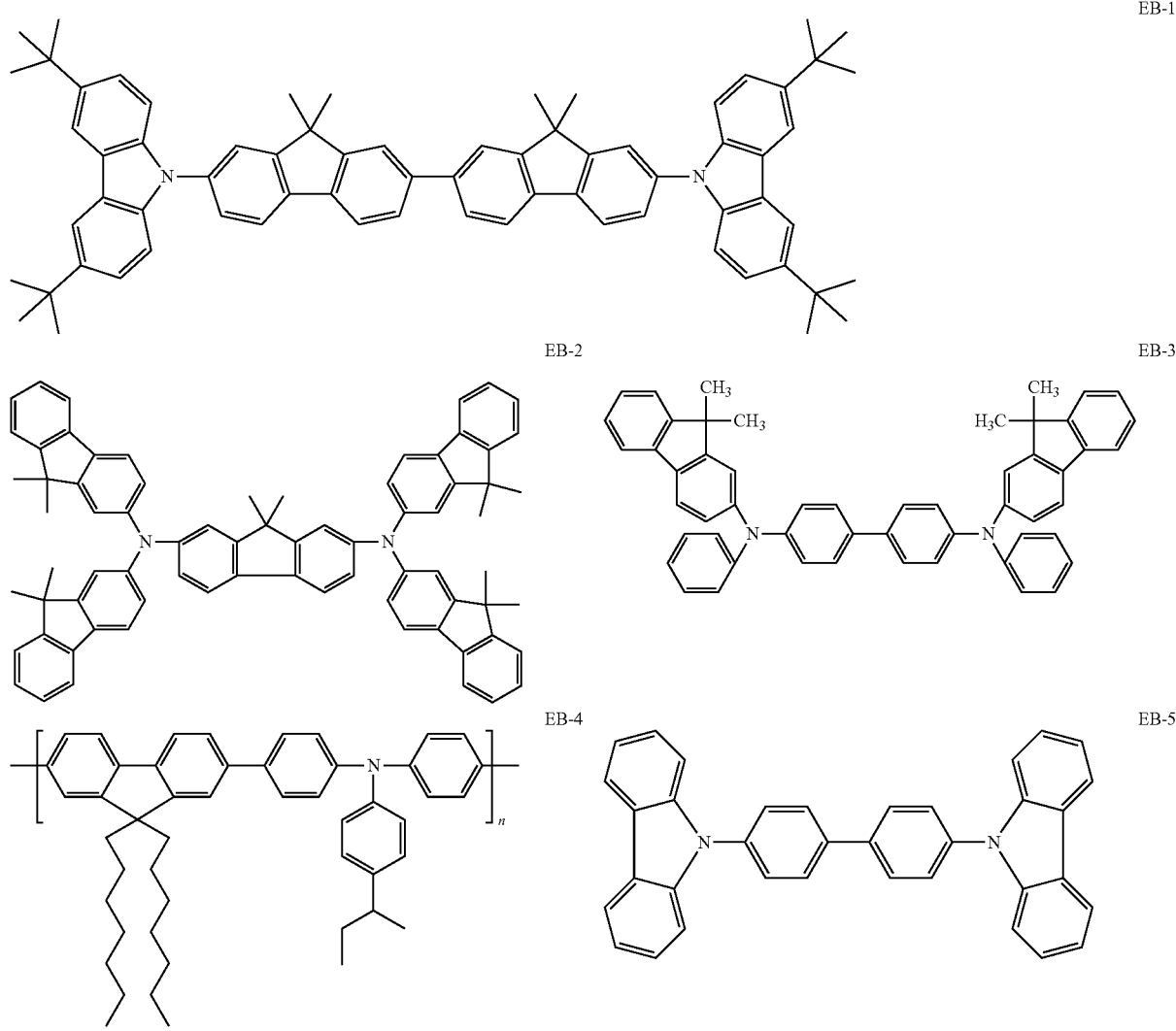

TABLE 1

| COMPOUND | μh$_{EBL}$ [cm$^2$/Vs] | Tg [° C.] |
| --- | --- | --- |
| EB-1 | 1.7E-03 | 208 |
| EB-2 | 1.1E-02 | 184 |
| EB-3 | 1.2E-03 | 121 |
| EB-4 | 5.0E-03 | 150 |
| EB-5 | 2.0E-03 | 162 |

A function required for the second interfacial layer 132 (hole blocking interfacial layer) is to block holes isolated from the photoelectric conversion layer 133 and transport electrons to the first electrode 131 (negative electrode). Accordingly, the second interfacial layer 132 is configured such that the positive electrode is replaced with the negative electrode and holes are replaced with electrons in the description of the first interfacial layer 134 described above. Further, light may be emitted from the negative electrode side, or light reflected from the negative electrode side may be used efficiently, and in this case, it is required to have high transmittance. In this regard, a preferable example of the hole blocking interfacial layer material may be an n-type semiconductor material such as an inorganic semiconductor such as titanium oxide TiO$_2$ and zinc oxide ZnO that is an n-type wide band gap semiconductor or an n-type semiconductor material such as fullerene C60. In particular, in an inorganic semiconductor of oxide-based, it is possible to easily change the electrical conductivity by controlling an oxidation degree by selecting conditions during film formation or a process treatment after film formation.

The film thickness of the interfacial layer is formed to be greater than or equal to about 1 nm and less than or equal to about 100 nm. In the interfacial layer, while injection of charges can be controlled by application of an electric field in the film thickness direction, charges can freely move in the horizontal direction with respect to the film thickness. When the electric conductivity as a film of the interfacial layer is high, this may appear as leak current or crosstalk between unit cells.

<Other Layers>

In FIG. 1, an insulation layer 136, a color filter layer 137, a planarization layer 138, and a lens layer 139 are arranged in this order along the Z direction on the second electrode 135. The insulation layer 136 may function as a protection layer or a passivation layer. The color filter layer 137 has color filters corresponding to a plurality of colors. For example, one unit cell 120 includes single color filter. The planarization layer 138 is arranged on the color filter layer 137 and has a flat upper surface. The lens layer 139 has a plurality of micro-lenses. For example, a single unit cell 120 includes a single micro-lens.

<<Manufacturing Method of Photoelectric Conversion Element and Photoelectric Conversion Device>>

A manufacturing method of a photoelectric conversion element and the photoelectric conversion device of the present embodiment will be described with reference to FIG. 1.

<Substrate 100>

First, a step of preparing the substrate 100 on which the wiring structure 106 is formed will be described. An element isolation portion 113 and the transistor 101 are formed on the substrate 100 that is a semiconductor substrate. The element isolation portion 113 has shallow trench isolation (STI) structure, for example. For example, the transistor 101 is an n-type MOS transistor and is formed of a gate electrode 104, a gate insulation film 103, a source/drain region 102, and a source/drain region 105. The source/drain regions 102 and 105 are formed of an n-type semiconductor region.

<Wiring Structure 106>

Next, the wiring structure 106 is formed on the substrate 100. A contact plug 107, a via plug 109, and a via plug 111 are made of a metal, for example, a material selected from Al, Cu, W, Ti, TiN, or the like and may have a stacked structure of titanium, titanium nitride, and tungsten in the present embodiment. A wiring layer 108 and a wiring layer 110 are made of a metal, for example, a material selected from Al, Cu, W, Ti, TiN, or the like and may have a stacked structure of tantalum and copper in the present embodiment. The insulation film 112 is made of a film of silicon oxide, silicon nitride, or the like, for example.

<First Electrode 131>

Next, the first electrode 131 is formed on the via plug 111. The first electrode 131 is formed such that the thickness is greater than or equal to about 10 nm and less than or equal to about 500 nm. The insulation film 112 may be formed after the first electrode 131 is formed. At this time, a planarization treatment is performed so that the upper surface height of the insulation film 112 and the upper surface height of the first electrode 131 match each other. The planarization treatment is performed by etching or a chemical mechanical polishing (CMP) method. A general semiconductor process can be applied to these manufacturing methods.

<Second Interfacial Layer 132>

Then, a film that becomes the second interfacial layer 132 is formed on the insulation film 112 and the first electrode 131. The film that becomes the second interfacial layer 132 is made of the materials described above and is deposited such that the thickness is greater than or equal to about 1 nm and less than or equal to about 100 nm by a deposition method or a sputtering method, for example. When the film thickness of the second interfacial layer 132 is thin, it is possible to reduce the voltage to be applied to the photoelectric conversion layer 133. On the other hand, when the film thickness of the second interfacial layer 132 is thick, it is possible to reduce hole passage due to the tunnel effect and further avoid a film defect such as a pinhole. For example, by increasing the film thickness of the second interfacial layer 132 compared to the unevenness of the surface of the first electrode 131, it is possible to reduce a defect of the second interfacial layer 132. The film thickness of the second interfacial layer 132 may be suitably set taking the above aspects into consideration.

Herein, illustration is provided with titanium oxide ($TiO_x$) as a material for the second interfacial layer 132 as an example. As an example, a $TiO_2$ film is formed on $TiO_2$ target with a desired thickness with predetermined RF power, a predetermined flow rate of argon gas, and a predetermined chamber pressure by using a sputtering device.

<Photoelectric Conversion Layer 133>

Next, the photoelectric conversion layer 133 is formed. Specifically, a quantum dots that are nanoparticles of a compound semiconductor are deposited on the overall surface of the substrate, which forms the photoelectric conversion layer 133. Herein, an example in which lead sulfide (PbS) is used as a quantum dot is illustrated. The quantum dot of lead sulfide (PbS) can be synthesized by the following scheme, for example.

[Synthesis Process]

Lead oxide (PbO), octadecene, and oleic acid are supplied in a three-neck flask, which is set to an oil bath. The oil bath is set at a predetermined temperature, the flask is filled with a nitrogen atmosphere, and nitrogen flow is performed at a predetermined flow rate for preventing oxidation of quantum dots in the reaction. Stirring is performed until the solution, which is pale-yellow when supplied, turns to a transparent solution. An octadecene solution of bistrimethylsilyl sulfide that is a sulfur source is separately prepared in a syringe in a glove box under a nitrogen atmosphere. The sulfur source is rapidly added to the transparent solution in the three-neck flask. The three-neck flask is removed from the oil bath after the addition, and when the temperature reaches room temperature by natural cooling, the process proceeds to the next purification process. Note that the color of the solution is black, and it is possible to confirm formation of quantum dots of lead sulfide (PbS) whose surface is capped by oleic acid.

[Purification Process]

An octadecene dispersion liquid of quantum dots obtained in the synthesis process is transferred from the three-neck flask to a centrifuge tube. By adding acetone that is a polar solvent to the octadecene dispersion liquid, this results in a state where stable dispersion of the quantum dots in octadecene is difficult, and the liquid is centrifuged by using a centrifugal separator to cause quantum dots to precipitate. The centrifuge tube is removed from the centrifugal separator, transparent acetone that is supernatant is removed, and then toluene that is a nonpolar solvent is added to the quantum dots precipitated at the bottom of the centrifuge tube. After toluene is added, quantum dots are re-dispersed in toluene by shaking the centrifuge tube. Acetone is added to the toluene dispersion liquid again, and the mixture is centrifuged for precipitation. The precipitation with acetone and the re-dispersion with toluene are repeated three times to purify a quantum dot dispersion liquid, and thereby a quantum dot toluene dispersion liquid is obtained. Note that a polar solvent used for precipitating quantum dots may be methanol, ethanol, or the like, and a preferable solvent is a solvent having a small impact on oleic acid protecting quantum dots, that is, having less release from the quantum dots surface.

[Application Liquid Creation Process]

Acetone is added to the quantum dot toluene dispersion liquid obtained in the purification process, and the mixture is similarly centrifuged for precipitation. Finally, a solution in which quantum dots are re-dispersed in octane rather than toluene at a predetermined concentration is used as a quantum dot coating liquid.

[Forming Process of Quantum Dot Film]

First, the quantum dot coating liquid described above is dripped on the center of a substrate, and spin coating is performed. The spin-coated quantum dot film is an assembly of quantum dots capped with oleic acid having a large molecular length and thus tends to have a large gap between quantum dots, poor conductivity of a photo-carrier generated by light irradiation, and a low photoelectric conversion function. Herein, the film is referred to as "oleic acid-capped quantum dot film".

Accordingly, it is preferable to perform ligand exchange from oleic acid to a ligand having a small molecular length. Herein, 1,3-benzenedithiol is used as an organic ligand. As a ligand solution for ligand exchange, N,N-dimethylformamide solution of 1,3-benzenedithiol is used. Halogen (iodine, chlorine, or bromine) can also be added as an inorganic ligand after ligand exchange with an organic ligand. For example, N,N-dimethylformamide solution of lead iodide can be used.

Ligand exchange is performed by applying the ligand solution described above on the oleic acid-capped quantum dot film formed on the substrate. Specifically, a ligand solution is applied on the overall oleic acid-capped quantum dot film, and ligand exchange is performed for a predetermined period. The reaction period may be suitably changed in view of the concentration of the ligand solution to be used. After a predetermined reaction period has passed, the substrate is rotated for a certain period to shake off and dry the liquid. After the ligand exchange, to remove excess ligands remaining on the film, rinse is performed with acetonitrile or methanol that is a solvent to dissolve a ligand. Further, to remove oleic acid released from quantum dots, rinse is performed with octane, and thereby oleic acid of the oleic acid-capped quantum dot film is released and replaced with a predetermined ligand, which forms 1,3-benzenedithiol quantum dot film. At this time, the film thickness of the ligand-exchanged 1,3-benzenedithiol quantum dot film is greater than or equal to 40 nm and less than or equal to 60 nm. Further, after the ligand exchange with these organic ligands, iodide addition can be performed by using lead iodide solution in the same ligand exchange procedure as described above.

Note that the organic ligand is not limited to 1,3-benzenedithiol and may be at least one type of ligands selected from ligands such as an organic compound including ethanedithiol, 1,4-benzenedithiol, 4-methylbenzoic acid, benzenediamine, and dibenzenediamine. In particular, since a ligand such as benzenedithiol including a benzene ring has a boiling point exceeding 200° C., release and degradation or volatilization of the ligand from the quantum dot surface are suppressed even in a high temperature of 140° C. or higher, and thus heat resistance as a quantum dot film is improved. Further, while a ligand such as 3-mercaptopropionic acid may be selected, a ligand having a benzene ring is preferable in terms of heat resistance.

Formation of the oleic acid-capped quantum dot film, ligand exchange, and rinse are repeated again on this ligand-exchanged quantum dot film (40 nm to 60 nm in thickness), and thereby an iodized 1,3-benzenedithiol quantum dot film having a desired film thickness can be formed.

<First Interfacial Layer 134>

Then, a film that becomes the first interfacial layer 134 is formed on the photoelectric conversion layer 133. The film that becomes the first interfacial layer 134 is made of the materials described above and is deposited such that the thickness is greater than or equal to about 1 nm and less than or equal to about 100 nm by a deposition method or a sputtering method, for example. When the film thickness of the first interfacial layer 134 is thin, it is possible to reduce a voltage to be applied to the photoelectric conversion layer 133. On the other hand, when the film thickness of the first interfacial layer 134 is thick, it is possible to reduce electron passage due to the tunnel effect and further avoid a film defect such as a pinhole. For example, by increasing the film thickness of the first interfacial layer 134 compared to the unevenness of the surface of the second electrode 135, it is possible to reduce a defect of the first interfacial layer 134. The film thickness of the second interfacial layer 132 may be suitably set taking the above aspects into consideration.

<Second Electrode 135>

Then, the second electrode 135 is formed. In detail, ITO, IZO, ZnO, or the like is deposited on the first interfacial layer 134 to form the second electrode 135.

<Anneal Treatment>

An anneal process is performed on the formed device for improving photoelectric conversion efficiency or improving carrier injection. An anneal temperature is determined in accordance with heat resistance of a material used for each layer and is preferably at least lower than the lowest glass transition temperature in the organic compounds to be used. Further, to ensure sufficient durability with respect to a temperature that may be applied in each process, it is preferable that the glass transition temperature of an organic material be at least 100° C. or higher.

<Other Layers>

Then, an insulation layer 136, a color filter layer 137, a planarization layer 138, and a lens layer 139 are formed in order. A general manufacturing method of a semiconductor device can be applied for the manufacturing methods thereof.

<Applied Voltage and External Quantum Efficiency>

Figure 2:
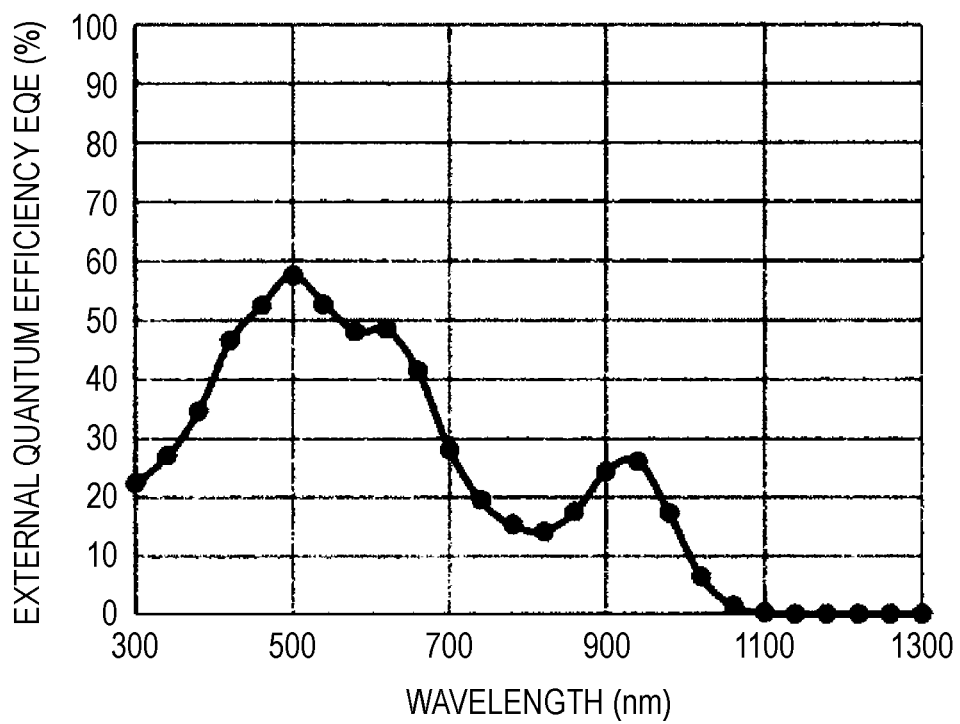
FIG. 2 is a diagram illustrating external quantum efficiency of the photoelectric conversion element in the present embodiment.

As described above, the photoelectric conversion device illustrated in FIG. 1 can be manufactured. In the photoelectric conversion element of the present embodiment, it is preferable that a voltage applied between the first electrode 131 and the second electrode 135 be higher than or equal to 1 V. FIG. 2 illustrates an example of external quantum efficiency of the photoelectric conversion element fabricated in accordance with the present embodiment.

<<Residual Image Evaluation>>

A residual image refers to a phenomenon in which charges are unable to be completely transferred in a single scan and remain in the next scan. Since, a rapid change of incident light intensity is unable to be followed by the transfer, and an image that appears to be with a trail is obtained at actual photographing of a moving image, a residual image should be reduced as much as possible. By measuring a transient response of a current value as described below, it is possible to evaluate whether or not a residual image is caused by the structure of a photoelectric conversion element interposed between the second electrode 135 and the first electrode 131 of the photoelectric conversion device.

Figure 3A:
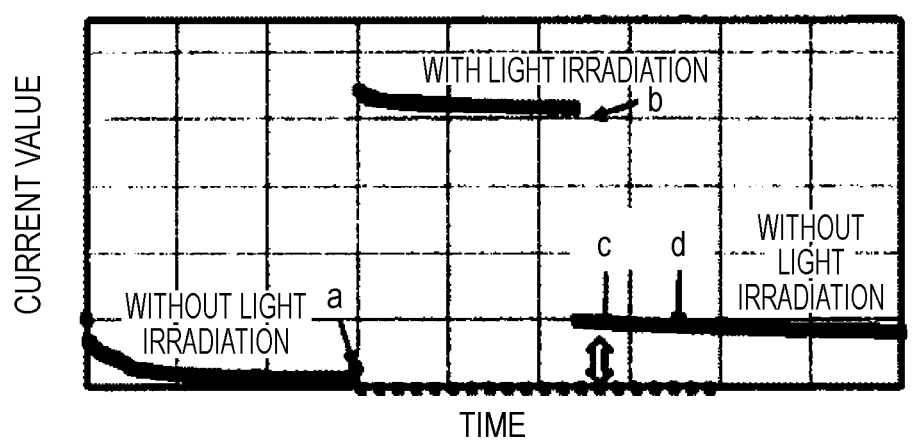
FIG. 3A is a measurement example of a photocurrent transient response of the photoelectric conversion element in accordance with presence or absence of light irradiation.
Figure 3B:
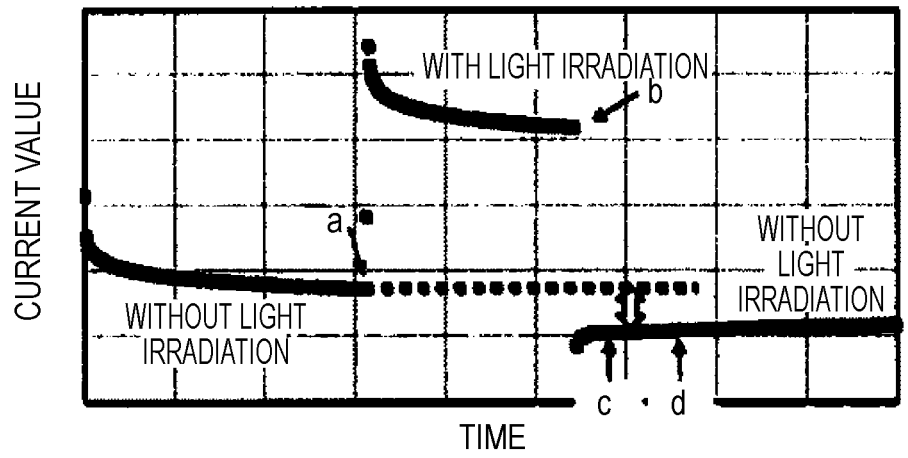
FIG. 3B is a measurement example of a photocurrent transient response of the photoelectric conversion element in accordance with presence or absence of light irradiation.

FIGS. 3A and 3B are measurement examples of a transient response of the photoelectric conversion element in accordance with presence or absence of light irradiation. First, a value of dark current when current is conducted for a certain period until the dark current is stabilized without light irradiation is denoted as "a". Next, light irradiation is performed, and a value of light current after a certain period has passed is denoted as "b". Then, light is turned off, a value of dark current after a short period has passed is denoted as "c", and a value of dark current after another period has passed is denoted as "d".

In the present embodiment, a residual image is converted into a numerical value by using the following Equation (3).

$$\text{Residual image (\%)} = |\{(\text{cor } d) - a\}|/|(b-a)| \quad (3)$$

In FIGS. 3A and 3B, current denoted by the bidirectional arrow (⇔) corresponds to an observed residual image. The residual image includes two types of "lightening" in which dark current immediately after light irradiation ends increases from the initial dark current illustrated in FIG. 3A and "darkening" in which dark current immediately after light irradiation ends decreases from the initial dark current illustrated in FIG. 3B.

Figure 4:
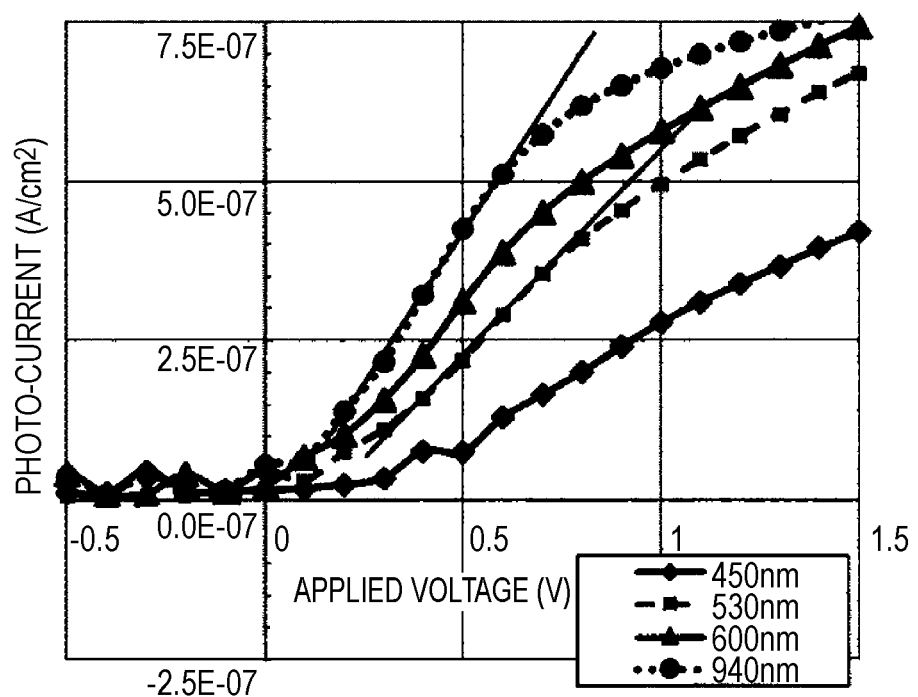
FIG. 4 is a voltage-current curve in each irradiation light wavelength of the photoelectric conversion element.

While it is desirable that the applied voltage in transition response measurement be the maximum voltage applied between electrodes in driving of the photoelectric conversion device, the applied voltage has a lower limit. FIG. 4 illustrates main voltage-current curves in each irradiation light wavelength of a photoelectric conversion element. The lower limit value is present at a point where the voltage-current curve rises and is saturated, and the slope of the curve then begins to decrease. Since the lower limit values in accordance with the irradiation wavelength are different from each other, it is desirable that the lower limit value be 1 V in order to include all the lower limit values.

<<Use Example of Photoelectric Conversion Element>>

The photoelectric conversion element according to one embodiment of the present disclosure may be used for a photoelectric conversion device such as a light receiving element, an image sensor, or the like. The light receiving element has a photoelectric conversion element, a readout circuit that reads charges from the photoelectric conversion element, and a signal processing circuit that receives charges from the readout circuit and performs signal processing thereon. The image sensor has a plurality of pixels and a signal processing circuit connected to the pixels, and each of the pixels having a photoelectric conversion element and a readout circuit connected to the photoelectric conversion element.

The photoelectric conversion element according to one embodiment of the present disclosure may be used for an imaging device. The imaging device has an optical system having a plurality of lenses and a light receiving element that receives light that has transmitted through the optical system, and the light receiving element is a light receiving element having a photoelectric conversion element. Specifically, the imaging device may be a digital still camera or a digital video camera.

Figure 5:
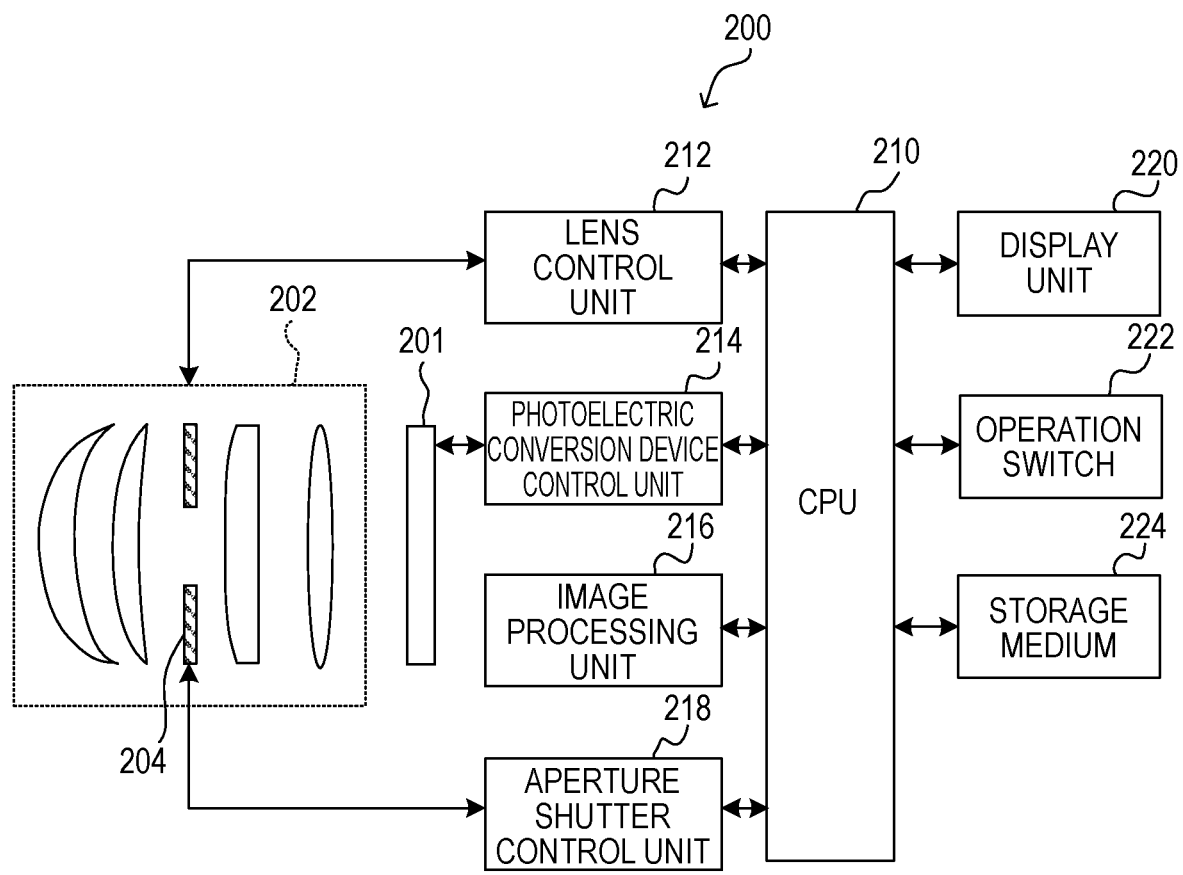
FIG. 5 is a diagram illustrating an example of an imaging system using a photoelectric conversion element according to one embodiment of the present disclosure.

FIG. 5 is a diagram illustrating an example of an imaging system using the photoelectric conversion element according to one embodiment of the present disclosure. As illustrated in FIG. 5, an imaging system 200 includes a photoelectric conversion device 201, an imaging optical system 202, a CPU 210, a lens control unit 212, a photoelectric conversion device control unit 214, an image processing unit 216, an aperture shutter control unit 218, a display unit 220, an operation switch 222, and a storage medium 224.

The imaging optical system 202 is an optical system for forming an optical image of an object and includes a lens group, an aperture 204, and the like. The aperture 204 has a function of adjusting the light amount during photographing by adjusting the aperture diameter thereof and, in addition, has a function of a shutter for adjusting the exposure time during still image photographing. The lens group and the aperture 204 are held in a telescopic manner along the optical axis direction and realize a magnification function (zoom function) or a focus adjustment function by an interlocking operation thereof. The imaging optical system 202 may be integrated in the imaging system or may be an imaging lens that can be mounted on the imaging system.

In an image space of the imaging optical system 202, the photoelectric conversion device 201 is arranged such that the imaging plane thereof is located in the image space. The photoelectric conversion device 201 is the photoelectric conversion device according to one embodiment of the present disclosure and formed including a CMOS sensor (pixel unit) and the peripheral circuit thereof (peripheral circuit region). In the photoelectric conversion device 201, pixels each having a plurality of photoelectric conversion units are two-dimensionally arranged and color filters are arranged to these pixels to form a two-dimensional single-plate color sensor. The photoelectric conversion device 201 photoelectrically converts an object image captured by the imaging optical system 202 and outputs an image signal or a focus detection signal.

The lens control unit 212 is used for controlling telescopic driving of the lens group of the imaging optical system 202 to perform magnification operation or focus adjustment and is formed of a circuit or a processing device configured to implement such a function. The aperture shutter control unit 218 is used for changing the aperture diameter of the aperture 204 (changing the aperture value) to adjust the photographing light amount and is formed of a circuit or a processing device configured to implement such a function.

The CPU 210 is a control device in the camera responsible for various control of the camera body and includes a calculation unit, a ROM, a RAM, an analog-to-digital (A/D) converter, a digital-to-analog (D/A) converter, a communication interface circuit, and the like. The CPU 210 controls operations of respective components in the camera in accordance with a computer program stored in the ROM or the like and performs a series of photographing operations, such as AF including detection of a focus state (focus detection), image capturing, image processing, storage or recording, or the like of the imaging optical system 202. The CPU 210 also is a signal processing unit.

The photoelectric conversion device control unit 214 is used for controlling the operation of the photoelectric conversion device 201, performing A/D conversion on a signal output from the photoelectric conversion device 201, and transmitting the converted signal to the CPU 210 and is formed of a circuit or a processing device configured to implement such a function. The A/D conversion function may be provided in the photoelectric conversion device 201. The image processing unit 216 is used for performing image processing such as γ-conversion or color interpolation on a signal obtained by A/D conversion to generate an image signal and is formed of a circuit or a processing device configured to implement such a function. The display unit 220 is a display device such as a liquid crystal display (LCD) and displays information on a photographing mode in the camera, a preview image before photographing, a confirmation image after photographing, a focusing state at focus detection, or the like. The operation switch 222 is formed of a power switch, a release (photographing trigger) switch, a zoom operation switch, a photographing mode selection switch, or the like. The storage medium 224 is used for storing a photographed image or the like and may be built in the imaging system or may be removable such as a memory card.

As described above, the imaging system 200 to which the photoelectric conversion device 201 according to one embodiment of the present disclosure is applied is configured, and thus a high-performance imaging system can be realized.

The photoelectric conversion device according to one embodiment of the present disclosure may be used for a moving unit. The moving unit has a body on which the photoelectric conversion device is provided and a traveling unit that moves the body. Specifically, the moving unit may be an automobile, an airplane, a ship, a drone, or the like. The photoelectric conversion device may be provided to the moving unit to capture an image of surrounding circumstances and support the operation of the moving unit. The body may be formed of a metal or a carbon fiber. As a carbon fiber, polycarbonate or the like may be used. The traveling unit may be a tire, a mechanism using magnetic floating, a mechanism that evaporates and ejects fuel, or the like.

Figure 6A:
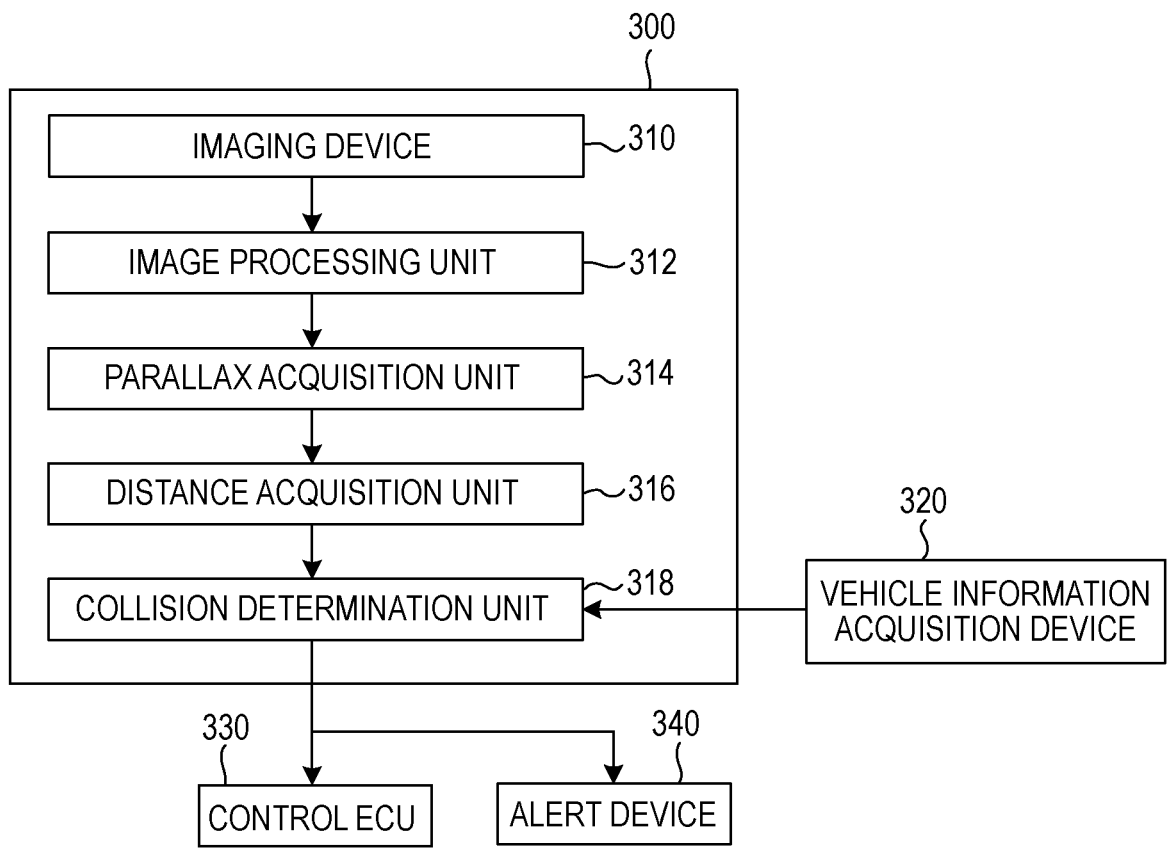
FIG. 6A is a diagram illustrating a configuration of an imaging system and a moving unit according to the present embodiment.
Figure 6B:
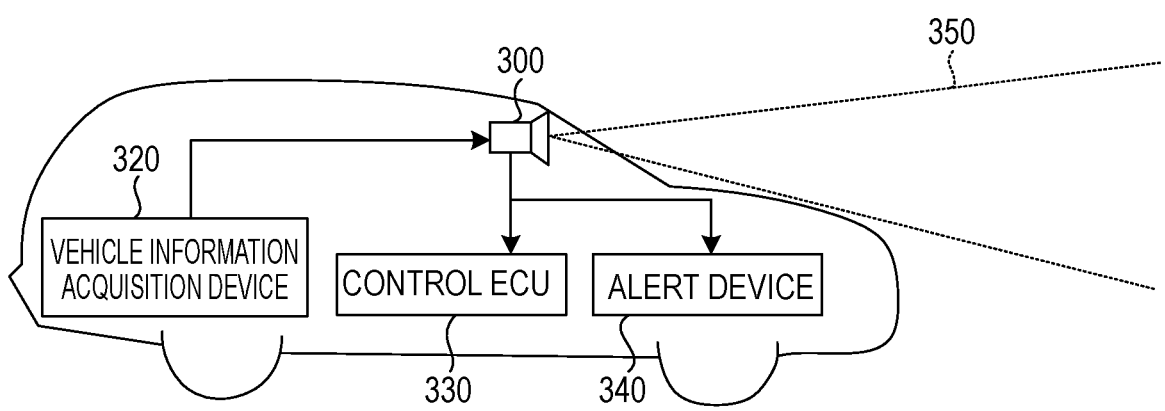
FIG. 6B is a diagram illustrating a configuration of an imaging system and a moving unit according to the present embodiment.

FIG. 6A and FIG. 6B are diagrams illustrating a configuration of an imaging system and a moving unit according to the present embodiment.

FIG. 6A illustrates an example of an imaging system 300 related to an on-vehicle camera. The imaging system 300 has an imaging device 310. The imaging device 310 is the imaging device described in the present embodiment. The imaging system 300 has an image processing unit 312 that is a processing device that performs image processing on a plurality of image data acquired by the imaging device 310. Further, the imaging system 300 has a parallax acquisition unit 314 that is a processing device that calculates a parallax (a phase difference of parallax images) from the plurality of image data acquired by the imaging device 310. Further, the imaging system 300 has a distance acquisition unit 316 that is a processing device that calculates a distance to the object based on the calculated parallax and a collision determination unit 318 that is a processing device that determines whether or not there is a collision possibility based on the calculated distance. Herein, the parallax acquisition unit 314 and the distance acquisition unit 316 are an example of an information acquisition unit that acquires information such as distance information on the distance to the object. That is, the distance information is information on a parallax, a defocus amount, a distance to an object, or the like. The collision determination unit 318 may use any of the distance information to determine the collision possibility. The various processing devices described above may be implemented by dedicatedly designed hardware or may be implemented by general hardware that performs calculation based on a software module. Further, the processing devices may be implemented by a field programmable gate array (FPGA), an application specific integrated circuit (ASIC), or the like or may be implemented by a combination thereof.

The imaging system 300 is connected to the vehicle information acquisition device 320 and can acquire vehicle information such as a vehicle speed, a yaw rate, a steering angle, or the like. Further, the imaging system 300 is connected to a control ECU 330, which is a control device that outputs a control signal for causing a vehicle to generate braking force based on a determination result by the collision determination unit 318. That is, the control ECU 330 is an example of a moving unit control unit that controls a moving unit based on distance information. Further, the imaging system 300 is also connected to an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying a brake, pushing back an accelerator, suppressing engine power, or the like. The alert device 340 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 300. FIG. 6B illustrates the imaging system 300 when a front area of a vehicle (a capturing area 350) is captured. The vehicle information acquisition device 320 transmits an instruction to cause the imaging system 300 to operate and perform image capturing. By using the imaging device of the present embodiment as the imaging device 310, the imaging system 300 of the present embodiment can further improve the ranging accuracy.

Although the example of control for avoiding a collision to another vehicle has been described above, the embodiment is applicable to automatic driving control for following another vehicle, automatic driving control for not going out of a traffic lane, or the like. Furthermore, the imaging system is not limited to a vehicle such as an automobile and can be applied to a moving unit (transport apparatus) such as a ship, an airplane, or an industrial robot, for example. A moving apparatus in a moving unit (transport apparatus) may be various traveling units such as an engine, a motor, a wheel, a propeller, or the like. In addition, the imaging system can be widely applied to a device which utilizes object recognition, such as an intelligent transportation system (ITS), without being limited to moving units.

EXAMPLES

While examples of the present disclosure will be described below, the present invention is not limited to the scope described in the examples. In the present example, the following photoelectric conversion element using each organic electron blocking layer material is fabricated, and the element characteristics are evaluated. Note that the present examples indicate effects of a reduction in a residual image by evaluating characteristics of various combinations of elements. Accordingly, since an electron blocking layer material, a film thickness of each layer in an element, and a layer configuration illustrated below are one example, the present invention is not limited to only the examples disclosed herein.

Example 1

An electron collecting electrode (first electrode), a hole blocking layer (second interfacial layer), a photoelectric conversion layer, an electron blocking layer (first interfacial layer), and a hole collecting electrode (second electrode) were stacked in this order on a Si substrate to form a photoelectric conversion element in the present example.

First, a Si substrate in which a wiring layer and an insulation layer were stacked, and a contact hole was formed in a conductive manner from the wiring layer by providing an opening in insulating layer at a portion corresponding to each pixel was prepared. The contact hole was drawn out to the substrate edge by using a wiring, and a pad portion was formed. A TiN electrode was film-formed so as to overlap the contact hole portion, desired patterning was performed, and a TiN electrode (electron collecting electrode) that is 0.64 $mm^2$ was formed. At this time, the film thickness of the TIN electrode was 60 nm.

On the Si substrate on which an electron collecting electrode was formed, an element was fabricated with the forming material and at the film thickness illustrated in Table 2 in the order described above. An anneal treatment was performed at 100° C. for one hour on the fabricated element.

TABLE 2

|  | FORMING MATERIAL | FILM THICKNESS [nm] |
|---|---|---|
| ELECTRON COLLECTING ELECTRODE | TiN | 60 |
| HOLE BLOCKING LAYER | TiO$_2$ | 50 |
| PHOTOELECTRIC CONVERSION LAYER | NANOPARTICLE: PbS LIGAND: 1,3-benzenedithiol, PbI$_2$ | 200 |
| ELECTRON BLOCKING LAYER | EB-1 | 15 |
| HOLE COLLECTING ELECTRODE | ITO | 40 |

FIG. 2 illustrates external quantum efficiency of the photoelectric conversion device of the present example. Further, a specific manufacturing method of the hole blocking layer, the photoelectric conversion layer, the electron blocking layer, and the hole collecting electrode is as described below.

<Hole Blocking layer (Second Interfacial Layer)>

A TiOx film having a thickness of 50 nm was formed on a TiO$_2$ target under conditions of RF power of 500 W, 100 sccm of argon gas, and a chamber pressure of 0.5 Pa by using a sputtering device.

<Photoelectric Conversion Layer>

[Synthesis Process]

First, 892 mg of lead oxide (PbO), 40 mL of octadecene, and 4 mL of oleic acid were supplied in a three-neck flask, which was set to an oil bath. The setting temperature of the oil bath was 90° C., and the flask was filled with a nitrogen atmosphere, and nitrogen flow was performed at a flow rate of 0.5 L/min for preventing oxidation of quantum dots in the reaction. Stirring was performed for 30 minutes or more until the solution, which was pale-yellow when supplied, turned to a transparent solution. Separately, 20 mL of 1.9 mM of bistrimethylsilyl sulfide that was a sulfur source in an octadecene solution was prepared in a syringe in a glove box at a nitrogen atmosphere. This sulfur source was rapidly added to the transparent solution in the three-neck flask. The three-neck flask was removed from the oil bath one minute after the addition, and when the temperature reached room temperature by two hours of natural cooling, the process proceeded to the next purification process. Note that the color of the solution was black, and generation of a quantum dot of lead sulfide (PbS) whose surface was capped by oleic acid was confirmed.

[Purification Process]

The octadecene dispersion liquid of quantum dots obtained in the synthesis process was transferred from the three-neck flask to a centrifuge tube. By adding acetone that is a polar solvent to the octadecene dispersion liquid, this resulted in a state where stable dispersion of the quantum dots in octadecene was difficult, and the liquid was centrifuged by using a centrifugal separator to cause quantum dots to precipitate. Note that the centrifugal separation condition was at 17,000 rpm for 20 minutes. The centrifuge tube was removed from the centrifugal separator, transparent acetone that was supernatant was removed, and then toluene that was a nonpolar solvent was added to the quantum dots precipitated at the bottom of the centrifuge tube. After toluene was added, quantum dots were re-dispersed in toluene by shaking the centrifuge tube. Acetone was added to the toluene dispersion liquid again, and the mixture was centrifuged at 15,000 rpm for 5 minutes for precipitation. The precipitation with acetone and the re-dispersion with toluene were repeated for three times to purify a quantum dot dispersion liquid, and thereby a quantum dot toluene dispersion liquid was obtained.

[Application Liquid Creation Process]

Acetone was added to the quantum dot toluene dispersion liquid obtained in the purification process, which was similarly centrifuged for precipitation. Finally, a solution in which quantum dots were re-dispersed in octane rather than in toluene to have a concentration of 80 mg/mL was used as the quantum dot coating liquid.

[Forming Process of Quantum Dot Film]

First, the quantum dot coating liquid described above was dripped on the center of a substrate, and spin coating was performed under a spin coating condition at 2,500 rpm for 30 seconds. The spin-coated quantum dot film was an oleic acid-capped quantum dot film (assembly of quantum dots capped with oleic acid whose molecular length is large).

Next, ligand exchange from oleic acid to a ligand having a small molecular length was performed. Herein, 1,3-benzenedithiol was used as an organic ligand. As a ligand solution for ligand exchange, 3 mM of 1,3-benzenedithiol in N,N-dimethylformamide solution was used.

The ligand solution was applied on the overall oleic acid-capped quantum dot film, and a ligand exchange reaction was performed for 30 seconds. The substrate was then rotated at 2,000 rpm for 60 seconds to shake off the liquid and was dried. After the ligand exchange, to remove excess ligands remaining on the film, rinse was performed with acetonitrile or methanol that is a solvent to dissolve a ligand. Moreover, to remove oleic acid released from a quantum dot, rinse was performed with octane, and thereby oleic acid of the oleic acid-capped quantum dot film was released and replaced with a predetermined ligand, which formed 1,3-benzenedithiol quantum dot film. At this time, the film thickness of the ligand-exchanged 1,3-benzenedithiol quantum dot film was greater than or equal to 40 nm and less than or equal to 60 nm. Further, after ligand exchange with these organic ligands, iodide addition was performed by using 10 mM of lead iodide in N,N-dimethylformamide solution in the same manner as the ligand exchange procedure described above.

After formation of oleic acid-capped quantum dot film, ligand exchange, and rinse were repeated again on the quantum dot film (40 nm to 60 nm in thickness) after this ligand exchange, an iodized-added 1,3-benzenedithiol quantum dot film having a desired film thickness was formed. Note that, in this example, these processes were repeated for four times to form a four-layers quantum dot film (200 nm in thickness).

<Electron Blocking layer (First Interfacial Layer)>

EB-1 having a thickness of 15 nm was deposited by using a deposition apparatus with a current value of 54 A and at deposition ratio of 1.5 Å/s from a tungsten boat.

<Hole Collecting Electrode>

An ITO having a thickness of 40 nm was deposited on an ITO target by using a sputtering apparatus under conditions of DC 400 V, 300 sccm of argon gas, and a chamber pressure of 0.5 Pa.

<Residual Image Evaluation>

A current transient response of a device in accordance with presence or absence of light irradiation was measured by using the fabricated elements. The measurement condition was that, after current was supplied with light being turned off for five minutes from start of voltage application, light irradiation was performed for four minutes, and the light was turned off for one minute. The applied voltage was set to 4.8 V. In Equation (3) described above, the symbol "c" corresponds to a value measured after 10 seconds, and the symbol "d" corresponds to a value measured after 60 seconds. For voltage application and current value measurement, a semiconductor parameter analyzer (4156B, Agilent Technologies) was used. For light irradiation, a surface emission white LED (TH-100X100SW, CCS Inc.) was used.

Note that the criterion of residual image evaluation is as follows, evaluation A or higher was determined as good, and evaluation B and evaluation C were determined as defect. The results are illustrated in Table 3.

AAA: The residual image rate measured 10 seconds and 60 seconds after light was turned off was less than 0.001%.

AA: The residual image rate measured 10 seconds after light was turned off was greater than or equal to 0.001% and less than 0.01%, and the residual image rate measured 60 seconds was less than 0.001%.

A: The residual image rate measured 10 seconds and 60 seconds after light was turned off was greater than or equal to 0.001% and less than 0.01%.

B: The residual image rate measured 10 seconds and 60 seconds after light was turned off was greater than or equal to 0.01% and less than 0.1%.

C: The residual image rate measured 10 seconds and 60 seconds after light was turned off was greater than or equal to 0.1%.

Examples 2 to 5, Comparative Examples 1 to 5

A photoelectric conversion element was fabricated and evaluated in the same manner as in Example 1 except that the compound included in the electron blocking layer was changed as illustrated in Table 3. The results are illustrated in Table 3. Further, compounds used in Comparative examples 1 to 3 are illustrated below.

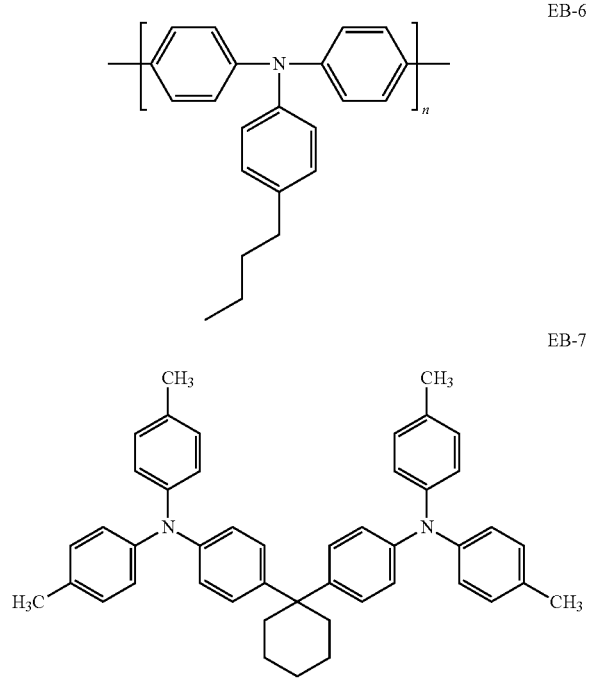

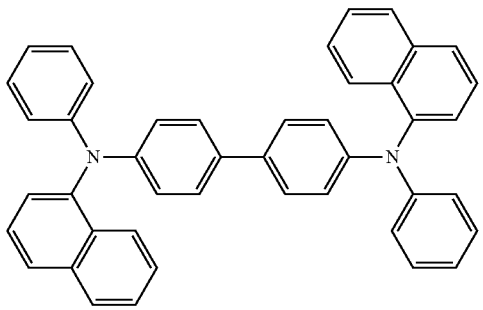

TABLE 3

| ELECTRON BLOCKING LAYER MATERIAL | $\mu h_{EBL}$ [cm$^2$/Vs] | $\mu h_{EBL}/\mu h_{PH}$ | Tg [° C.] | RESIDUAL IMAGE EVALUATION |
|---|---|---|---|---|
| EXAMPLE 1 | EB-1 | 1.7E-03 | 43 | 208 | AA |
| EXAMPLE 2 | EB-2 | 1.1E-02 | 275 | 184 | AAA |
| EXAMPLE 3 | EB-3 | 1.2E-03 | 30 | 121 | A |
| EXAMPLE 4 | EB-4 | 5.0E-03 | 125 | 150 | AAA |
| EXAMPLE 5 | EB-5 | 2.0E-03 | 50 | 162 | AA |
| COMPARATIVE EXAMPLE 1 | EB-6 | 1.0E-04 | 3 | 155 | B |
| COMPARATIVE EXAMPLE 2 | EB-7 | 1.0E-02 | 250 | 89 | C |
| COMPARATIVE EXAMPLE 3 | EB-8 | 8.8E-04 | 22 | 95 | C |
| COMPARATIVE EXAMPLE 4 | MoO$_3$ | <10$^{-5}$ | <0.25 | — | C |
| COMPARATIVE EXAMPLE 5 | NO | — | — | — | B |

As illustrated in Table 3, the electron blocking layer materials having evaluation A or higher meet both of Equation (1) and the glass transition temperature being 100° ° C. or higher. These electron blocking layer materials have a triphenylamine moiety that contributes to improvement of hole mobility and a fluorene moiety or a carbazole moiety that is superior in the heat resistance.

Further, electron blocking layer materials having evaluation A or higher meet both of the glass transition temperature being 100° C. or higher and Equation (2), and in these materials, the evaluation of materials having a higher Tg is AA or higher, and in particular, the evaluation of materials having a large $\mu h_{EBL}/\mu h_{PH}$ value is AAA.

Materials having evaluation B or C are materials that have a lower glass transition temperature of an electron blocking layer material than 100° C., fail to meet Equation (1), or fail to meet Equation (2).

Therefore, when the first interfacial layer (electron blocking layer) meets one or more of the conditions 1 to 3 described above, a reduction in a residual image can be realized.

According to the photoelectric conversion element of the present disclosure, it is possible to reduce a residual image while enhancing heat resistance.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-068921, filed Apr. 7, 2020, which is hereby incorporated by reference herein in its entirety.

What is claimed is:

1. A photoelectric conversion element comprising:
a first electrode;
a photoelectric conversion layer;
a first interfacial layer; and
a second electrode in this order,
wherein the photoelectric conversion layer has a quantum dot,
wherein the quantum dot is a PbS quantum dot,
wherein the first interfacial layer has an organic compound having a glass transition temperature of 100° C. or higher and including a fluorene moiety, and
wherein the organic compound does not have acceptor substituents;
wherein following Equation (1) is met:

$$\mu h_{EBL} \geq 1.0 \times 10^{-3} (cm^2/Vs) \quad \text{Equation (1),}$$

wherein $\mu h_{EBL}$ denotes hole mobility of the first interfacial layer.

2. The photoelectric conversion element according to claim 1, wherein a voltage applied between the first electrode and the second electrode is higher than or equal to 1 V.

3. The photoelectric conversion element according to claim 2, wherein the quantum dot has a nanoparticle, and the nanoparticle includes PbS, PbSe, PbTe, InP, InAs, CdS, CdSe, or CdTe.

4. The photoelectric conversion element according to claim 1, wherein the organic compound is at least one of following compounds:

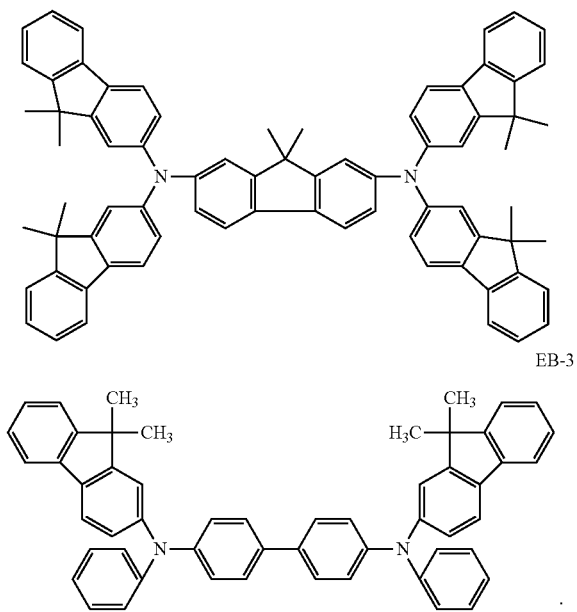

5. The photoelectric conversion element according to claim 1 further comprising a second interfacial layer between the first electrode and the photoelectric conversion layer.

6. The photoelectric conversion element according to claim 5, wherein the second interfacial layer has titanium oxide or zinc oxide that is an n-type wide band gap semiconductor.

7. The photoelectric conversion element according to claim 1, wherein the first electrode has titanium or titanium nitride.

8. The photoelectric conversion element according to claim 1, wherein the quantum dot has a nanoparticle, and a surface of the nanoparticle is coordinated with at least one type of organic ligands selected from 1,4-benzenedithiol and 1,3-benzenedithiol.

9. The photoelectric conversion element according to claim 1, wherein the quantum dot has a nanoparticle, and at least one type of halogens selected from iodine, chlorine, and bromine is added to a surface of the nanoparticle.

10. The photoelectric conversion element according to claim 1, further comprising at least one layer selected from a passivation layer, a lens layer, and a color filter layer on the first electrode or the second electrode.

11. An image sensor comprising:
a plurality of pixels; and
a signal processing circuit connected to the pixels, wherein the pixel has the photoelectric conversion element according to claim 1 and a readout circuit connected to the photoelectric conversion element.

12. A light receiving element comprising:
the photoelectric conversion element according to claim 1;
a readout circuit that reads charges from the photoelectric conversion element; and
a signal processing circuit that receives charges from the readout circuit and processes a signal.

13. An imaging device comprising:
an optical system having a plurality of lenses; and
a light receiving element that receives light that transmitted through the optical system,
wherein the light receiving element has the photoelectric conversion element according to claim 1.

14. A moving unit comprising:
a body provided with an imaging device; and
a traveling unit that causes the body to move,
wherein the imaging device is the imaging device according to claim 13.

15. The photoelectric conversion element according to claim 1, wherein the organic compound has a triarylamine moiety.

16. The photoelectric conversion element according to claim 1, wherein the organic compound has two or more amino groups.

* * * * *